United States Patent [19]

Moore

[11] 4,400,664
[45] Aug. 23, 1983

[54] DIGITAL PHASE DETECTOR

[75] Inventor: Phillip M. Moore, Phoenix, Ariz.

[73] Assignee: Motorola, Inc., Schaumburg, Ill.

[21] Appl. No.: 267,155

[22] Filed: May 26, 1981

[51] Int. Cl.³ ............................................. G01R 25/00
[52] U.S. Cl. .................................. 324/83 D; 328/133
[58] Field of Search ................ 324/83 R, 83 A, 83 D; 328/133

[56] References Cited

U.S. PATENT DOCUMENTS 3,953,794  4/1976  Moore .............................. 324/83 D Primary Examiner—Michael J. Tokar
Attorney, Agent, or Firm—Eugene A. Parsons

[57] ABSTRACT

An improvement on phase difference instrumentation wherein an accurate phase difference may be determined between two noisy signals, each of which may have a DC offset, where the measured signals have identical periods.

5 Claims, 9 Drawing Figures

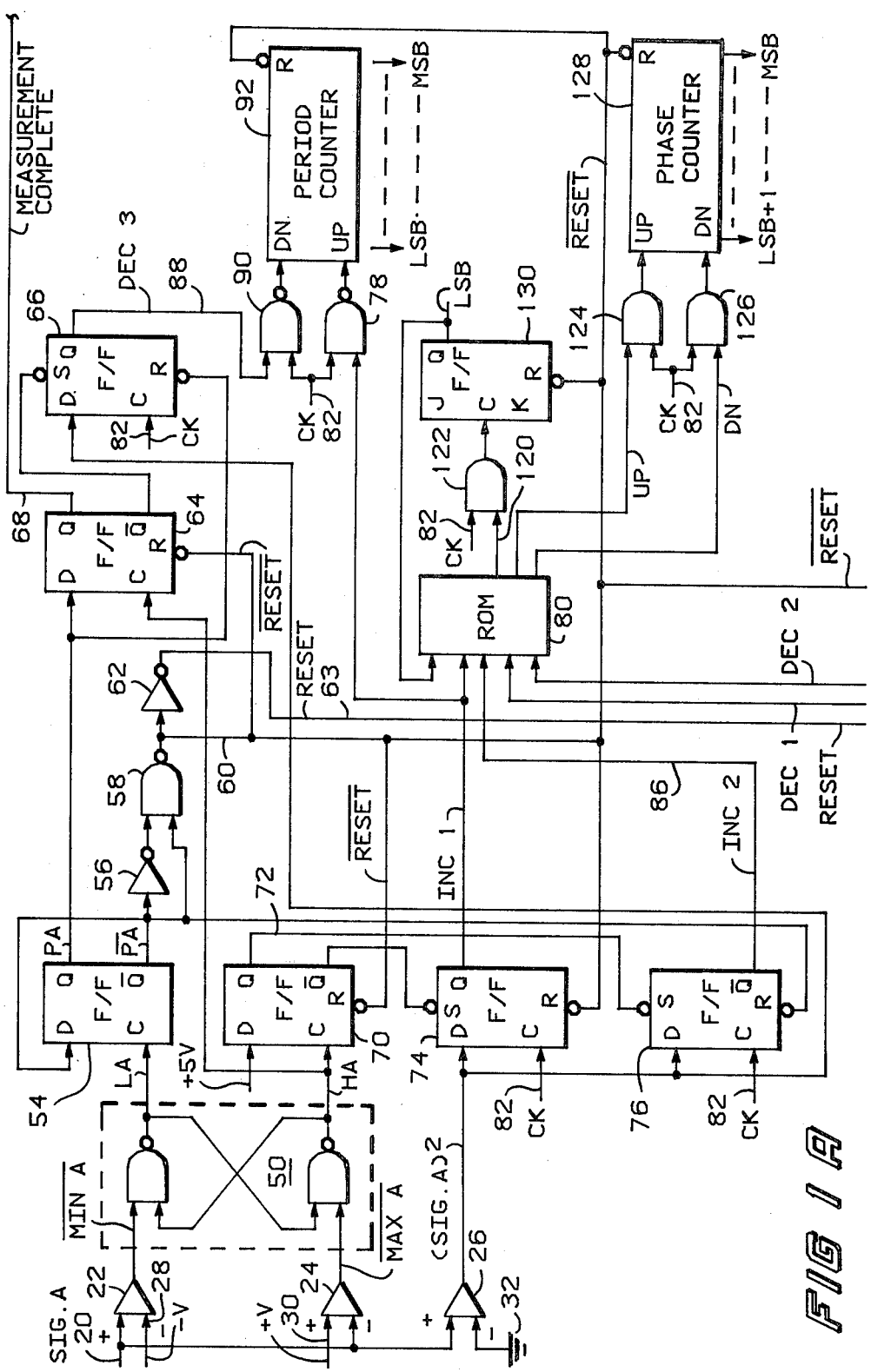

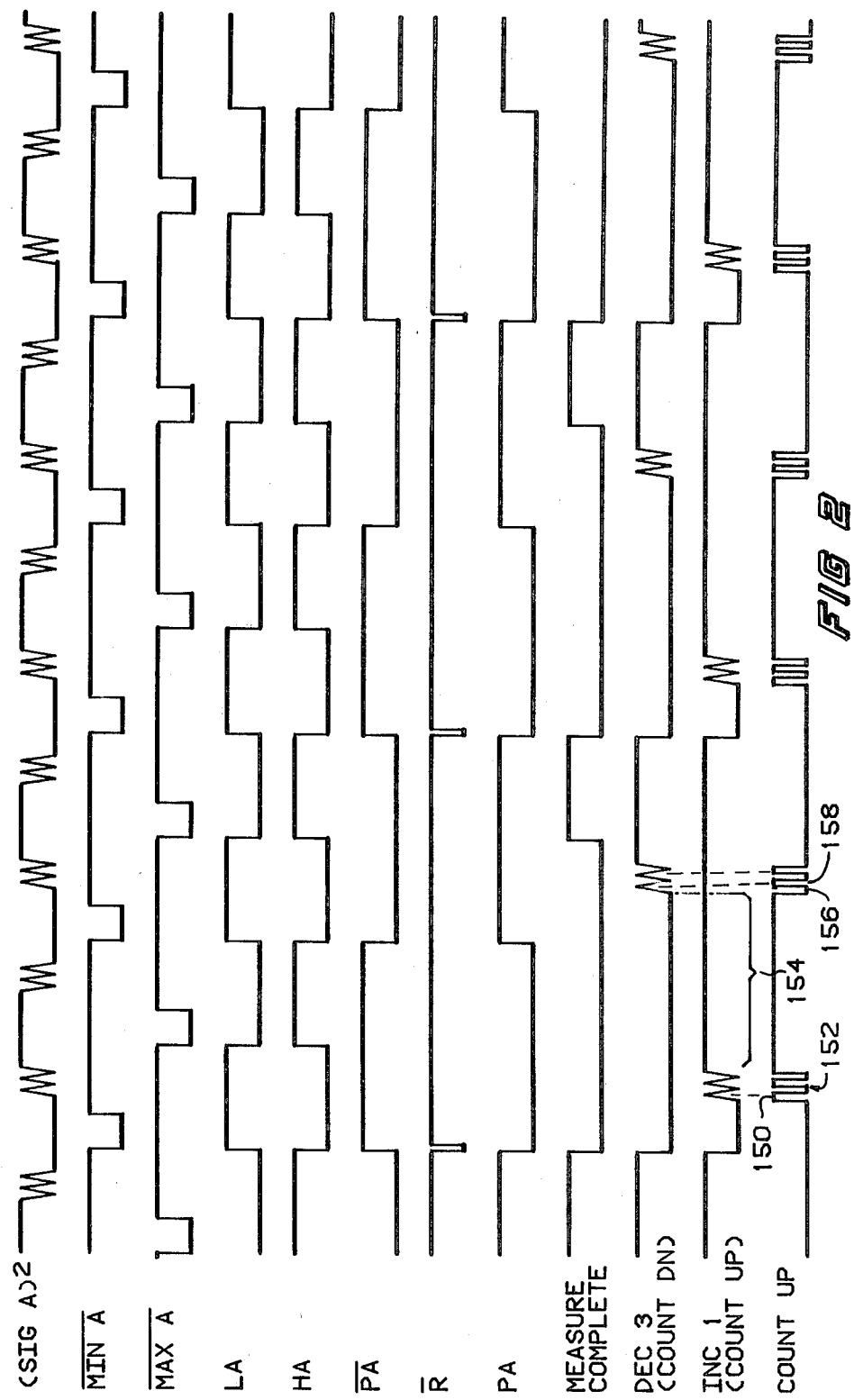

DIGITAL PHASE DETECTOR

BACKGROUND OF THE INVENTION

The invention relates to an improvement on my previously issued patent, U.S. Pat. No. 3,953,794, issued Apr. 27, 1976, for a "Digital Phase Detector".

The invention disclosed in the above patent provides an accurate phase measurement between two noisy signals having the same period, as long as the noisy signals are biased symmetrically about a zero reference level. Inaccuracies occur when the reference level is other than zero.

SUMMARY OF THE INVENTION

The problem of error caused by DC level shifts in the input signals, from whatever source (such as long term temperature or aging shifts), are overcome by the present invention by using a signal processing technique which measures signal to signal delay on two successive zero crossings in each of the pair of compared signals and the period of either of them.

It is therefore an object of the invention to make three measurements of time in order to determine the phase relationships between two noisy input signals which may be DC biased away from symmetry, according to the equations:

$$180° (t_1+t_2)/t_3 \tag{1}$$

$$[180° (t_1+t_2)/t_3] - 180° \tag{2}$$

where:
- $t_1$ is the time delay from the leading edge zero crossing of a first input signal to the next succeeding zero crossing of the second input signal,
- $t_2$ is the time delay from the trailing edge zero crossing of the first input signal to the next succeeding zero crossing of the second input signal, and
- $t_3$ is the period of the input signals.

Equation (1) or (2) is selected according to the time realtionship and the polarities of the zero crossings.

It is another object of the invention, in a digital phase detector requiring three time measurements to be made on counters, to accomplish two of the measurements on a single up-down counter by means of logic employing double incrementing/decrementing or no count at all.

These and other objects of the invention will be more readily understood upon study of the Detailed Description of the Invention which follows together with the drawings in which:

FIGS. 1A and 1B are a logic diagram of the system of the invention,

FIG. 2 is a series of waveform diagrams illustrative of certain of the signals to be found in the logic circuit of FIG. 1, FIG. 3 is a copy of FIG. 3 of U.S. Pat. No. 3,953,794 showing the waveforms used therein for determining zero crossover or threshold crossing points of a noisy input signal, FIG. 4 shows the phase relationship of modified (SIG A)$^2$ and (SIG B)$^2$ signals when the phase difference is more than zero degrees and less than 180°, FIG. 5 shows the phase relationship between (SIG A)$^2$ and (SIG B)$^2$ when the phase difference is more than 180° and less than 360°, FIG. 6 shows the phase relationship between (SIG A)$^2$ and (SIG B)$^2$ when the phase difference is very close to zero degrees (or 360°), FIG. 7 illustrates relevant timing diagrams for the phase difference case shown in FIG. 4, and FIG. 8 illustrates relevant timing diagrams for the phase difference case shown in FIG. 5.

DETAILED DESCRIPTION OF THE INVENTION

Figure 3:
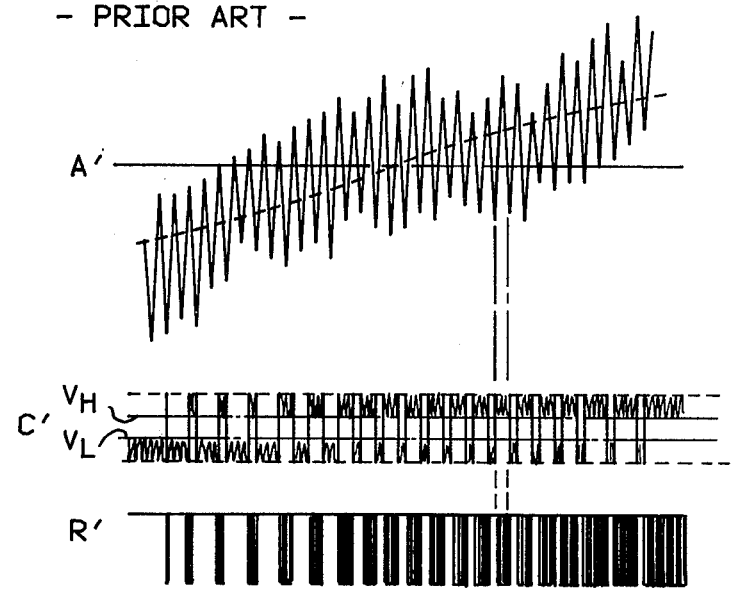

My U.S. Pat. No. 3,953,794 is incorporated herein by reference. This patent describes and claims a digital phase detector for measuring the phase relationship of two noisy input signals. Problems experienced in the use of the previous invention to process signals with non-zero DC bias components have prompted the work that led to the present invention. However, the portion of that patent which describes the technique for integrating counts during the noisy crossover portions of the noisy signals is applicable as well in the instant invention. For convenience, FIG. 3 of patent '794 is also reproduced herein as FIG. 3. Illustrated therein is an expanded portion of a noisy signal in the vicinity of a zero crossing point. This signal portion is shown at A' in FIG. 3. The signal at C' in FIG. 3 results from amplification and limiting of the signal A'. It should be noted that the multiple zero crossings are extremely steep in slope. At R' pulses are shown which represent counts of those portions of the signal at C' which are above a nominal zero crossing reference level, VL/VH. For practical purposes, the slope is steep enough that very little error is incurred because of any difference in pulse width at VL and at VH. For all practical purposes, the counter counts pulses represented by the R' waveform which occur during the positive peaks shown at C'. As was set forth in my U.S. Pat. No. 3,953,794, the pulses counted at R' have the effect of integrating the pulse count through the noisy zero crossing portion of A' and effectively result in a total count which is indicative of a zero crossing which is noise free.

Figure 1B:
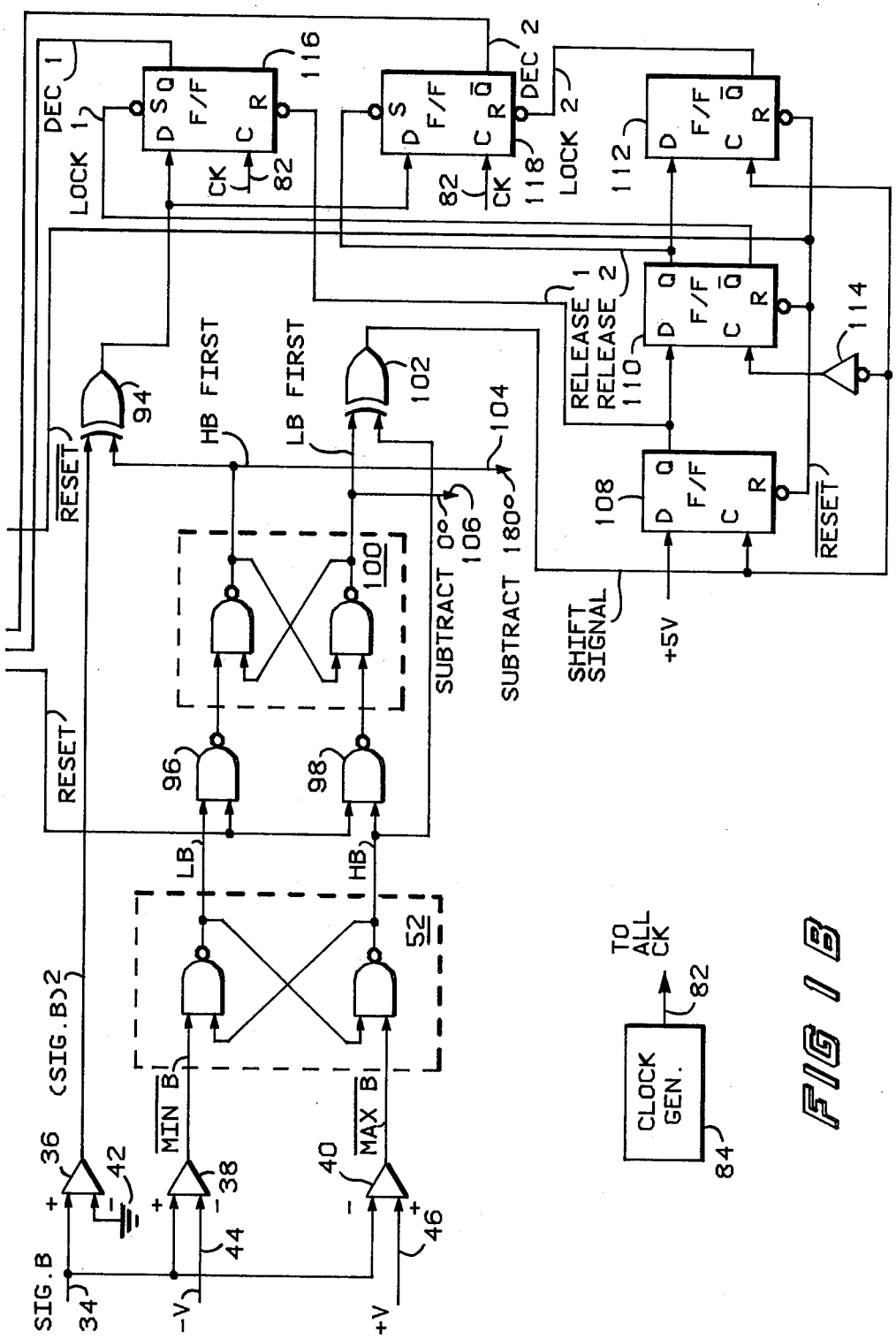

FIGS. 1A and 1B represent a logic block diagram of a preferred embodiment of the invention. Signal A (SIG A), a first noisy signal, is applied at input terminal 20 of amplifiers 22, 24 and 26. The negative polarity input 28 of amplifier 22 is connected to voltage source −V. The positive polarity input 30 of amplifier 24 is connected to voltage source +V. The negative polarity input of amplifier 26 is connected to ground via connection 32. Signal B (SIG B) is applied via connection 34 to the positive input of amplifier 36 and amplifier 38 and to the negative input of amplifier 40. The negative polarity input of amplifier 36 is connected to ground at 42. The negative polarity input to amplifier 38 is connected to voltage source −V at 44. The positive polarity input of amplifier 40 is connected to voltage source +V at 46. The output of amplifier 22 is MIN A. MIN A is applied to one input of DC flip-flop 50. The other input of DC flip-flop 50 is fed from MAX A which is derived from the output of amplifier 24. One output of DC flip-flop 50, LA, is fed to the clock (C) input of D type flip-flop 54. The Q output of flip-flop 54, PA, is fed back to the D input of flip-flop 54. PA is also fed to inverter 56, which feeds NAND gate 58, and to the other input of NAND gate 58. Output 60 of NAND gate 58 is the RESET signal for the system. RESET is fed through inverter 62 to generate RESET for the system. The Q output of flip-flop 54, PA, is fed to the D input of D type flip-flop 64. PA is also fed to the reset (R) input of flip-flop 66. The reset input to flip-flop 64 is the signal RESET. The clock input to flip-flop 64 is signal HA, an output of DC type flip-flop 50. The Q output of flip-flop 64 is the MEASUREMENT COMPLETE signal 68. The Q output of flip-flop 64 is fed to the set (S) input of D type flip-flop 66. Signal HA, an output from DC flip-flop output 50, is fed to the clock input of D type flip-flop 70. The D input of flip-flop 70 is connected to a source of +5 volts DC. The output of amplifier 6 is (SIG A)$^2$. (SIG A)$^2$ is fed to the D input of flip-flop 74 and to the D input of flip-flop 76. (SIG A)$^2$ is also fed to the D input of flip-flop 66. The clock input of flip-flop 66 is system clock 82. Signal RESET is fed to the R inputs of flip-flips 70 and 74. The Q output of flip-flop 70 is fed to the set input of flip-flop 74. The Q output of flip-flop 70 is fed to the set input of flip-flop 76. The Q output of flip-flop 74 is INCREMENT 1 (INC 1) and this signal is fed to one input of NAND gate 78 and to one input of ROM (Read Only Memory) 80. Signal PA from the Q output of flip-flop 54 is fed to the reset input of flip-flop 76. The clock inputs of flip-flops 74 and 76 are fed from the system clock 82, generated by clock generator 84. (The interconnections between generator 84 and the flip-flops are not shown in order to preserve the clarity of the circuit diagram of FIG. 1). The Q output of flip-flop 76 generates signal INCREMENT 2 (INC 2) on line 86. This signal is fed to ROM 80. The Q output of flip-flop 66 generates signal DECREMENT 3 (DEC 3) on line 88. Line 88 feeds NAND gate 90. NAND gates 78 and 90 are also fed from system clock 82 generated by clock generator 84. The output of NAND gate 90 feeds the DOWN (DN) input of period counter 92 and the output of NAND gate 78 feeds the UP input of period counter 92. RESET is fed to the reset (R) input of period counter 92.

(SIG B)$^2$ is the signal generated by the output of amplifier 36. This signal is fed to one input of exclusive OR gate 94. The output of amplifier 38 is MIN B. This signal is fed to one input of DC flip-flop 52. The output of amplifier 40 is signal MAX B which is fed to the other input of DC flip-flop 52. A first output of flip-flop 52, LB, is fed to one input of NAND gate 96. The other output from DC flip-flop 52, HB, is fed to one input of NAND gate 98 and to one input of exclusive OR gate 102. The other inputs to NAND gates 96 and 98 are fed in parallel from the system RESET line 63. The output of NAND gate 96 is fed to one input of DC flip-flop 100. The output of NAND gate 98 is fed to the other input of DC flip-flop 100. A first output of DC flip-flop 100 is labeled "HB FIRST". Another output of DC flip-flop 100 is labeled "LB FIRST". LB FIRST is fed to another input of exclusive OR gate 102. Signal HB FIRST is fed to the other input of exclusive OR gate 94. Signal HB FIRST is on line 104, an output labeled "SUBTRACT 180°". Signal LB FIRST is on line 106, an output labeled "SUBTRACT 0°". The output of exclusive OR gate 102 is used as a clock input to the three flip-flops 108, 110 and 112 which form a three stage shift register. The clock signal to flip-flop 110 is inverted by inverter 114. The reset inputs to flip-flop 108, 110 and 112 are the signal RESET. The D input of flip-flop 108 is fed from a fixed voltage of +5 volts DC. The Q output of flip-flop 108 is fed to the D input of flip-flop 110 and to the reset input of flip-flop 116. The reset input signal to flip-flop 116 is labeled "RELEASE 1". The Q output of flip-flop 110 is fed to the D input of flip-flop 112. This signal is labeled "RELEASE 2" and is also fed to the set input of flip-flop 118. The Q output of flip-flop 110 is fed to the set input of flip-flop 116 and is labeled "LOCK 1". The Q output of flip-flop 112 is labeled "LOCK 2" and is fed to the reset input of flip-flop 118. Flip-flops 116 and 118 have clock inputs fed from the system clock 82. The D inputs of flip-flops 116 and 118 are fed by the output of exclusive OR gate 94. The Q output of flip-flop 116 is DECREMENT 1 (DEC 1) and is fed to ROM 80. The Q output of flip-flop 118 is labeled "DECREMENT 2" (DEC 2) and is also fed to an input of ROM 80. One output 120 of ROM 80 is fed to NAND gate 122. Another input to NAND gate 122 is system clock 82. The UP output of ROM 80 is fed to one input of NAND gate 124. The DOWN (DN) output from ROM 80 is fed to one input of NAND gate 126. NAND gates 124 and 126 also have another input from system clock 82. The output of NAND gate 124 provides an UP input to phase counter 128. The output of NAND gate 126 provides a DOWN (DN) input to phase counter 128. Up-down counter 128 provides the least significant bit +1 (LSB+1) through the most significant bit (MSB) outputs for phase measurement. An output from NAND gate 122 is fed to the clock (C) input of JK flip-flop 130. This flip-flop and up/down counter 128 are reset by the system RESET signal on line 60. The Q output of flip-flop 130 is the least significant bit (LSB) signal for phase measurement and is fed to a input of ROM 80. This completes the connection description for FIG. 1.

In operation, two measurements must be made. The measurement of the period of SIGNAL A is made in period counter 92. (This, of course, is the same as the period of SIGNAL B). Referring to FIG. 2, a waveform diagram for those signal utilized in generating t$_3$, a count which is proportional to the period of SIGNAL A may be seen. In FIG. 2 (SIG A)$^2$ is represented as a square wave with noisy crossover points. Signal MIN A is derived from (SIG A)$^2$ and represents a negative pulse signal corresponding to a time portion of the negative peak of (SIG A)$^2$. Signal MAX A is a negative pulse signal which is representative of a time portion of the positive peaks of signal A. The widths of the negative portions of signals MIN A and MAX A may vary depending on the threshold levels of amplifiers 22 and 24, respectively. Signal LA is derived from signals MIN A and MAX A. Signal MIN A is fed to DC flip-flop 50 and causes signal LA to go high when MIN A is negative. (See FIG. 1.) When signal MAX A, fed to the other input of DC flip-flop 50, goes low, output signal LA goes high and output signal HA goes low. The relationship may be seen in FIG. 2. Signal LA is fed to D type flip-flop 54 and is utilized there as a clock input. This means that each time signal LA makes a positive transition, flip-flop 54 changes state. This is true because the Q output of flip-flop 54 is connected back to the D input.PA, the Q output of flip-flop 54, is used to generate system reset signal. It is applied to NAND gate 58 directly and through inverter 56; thereby, a negative RESET pulse is generated at the output of NAND gate 58. This is shown at R in FIG. 2. The R signal is inverted through inverter 62 to generate the system RESET 63. (See FIG. 1.) PA, which is also represented in FIG. 2, is the Q output of D type flip-flop 54. It is fed to the D input of flip-flop 64 and to the reset input of flip-flop 66. The Q output of flip-flop 64 on line 68 is a MEASUREMENT COMPLETE signal; that is, the signal on Q of flip-flop 64 goes positive at the measurement complete time. The Q output of flip-flop 64 is fed to the set (S) input of flip-flop 66. HA is used as the clock input for flip-flop 64 so that whenever HA makes a positive transition, the signal on the D input of flip-flop 64 will be transferred to the Q output of flip-flop 64 providing the aforesaid MEASUREMENT COMPLETE signal. The Q output of flip-flop 64 is used to set flip-flop 66 at the time that MEASUREMENT COMPLETE is generated. Again the relationship may be seen from FIG. 2. DECREMENT 3, the output signal from Q of flip-flop 66 goes low at the time signal PA goes low, see FIG. 2. INCREMENT 1, the output of Q of flip-flop 74, goes low upon the input of R at the reset input of flip-flop 74. INCREMENT 1 remains low until (SIG A)$^2$, applied to the D input of flip-flop 74, begins to go high. Since the transition of (SIG A)$^2$ is noisy (see (SIG A)$^2$ signal; FIG. 2) and since system clock 82 is of relatively high frequency compared to this noise, INCREMENT 1 comprises a series of high and low signals corresponding to the noise characteristics of (SIG A)$^2$ and to the threshold characteristics of amplifier 26. The signal, INCREMENT 1, is fed to one input of NAND gate 78. This is NANDed with clock signal 82 in NAND gate 78. Whenever the output of NAND gate 78 is high, period counter 92 will count UP providing there is no DOWN count input signal applied thereto. Since DECREMENT 3, the DOWN count input, is low throughout the period of the positive transition of (SIG A)$^2$, up-down counter 92 will count up only during the positive peaks of signal, INCREMENT 1. At the end of the transition of (SIG A)$^2$, INCREMENT 1 goes high and stays there until it is reset by R input to flip-flop 74. DECREMENT 3 remains low throughout this period of time. DECREMENT 3 goes high upon the second positive transition of (SIG A)$^2$. This may be seen by again reviewing FIG. 2. Period counter 92 responds to simultaneous up and down input commands with no count. It will count up only if there is an UP signal applied and it will count down only when there is a DOWN signal applied. Therefore, during any time period when both DECREMENT 3 and INCREMENT 1 are high, period counter 92 will not count. However, whenever DECREMENT 3 is low and INCREMENT 1 is high, period counter 92 will count up. The net result is shown in the count up waveform of FIG. 2. During positive half cycles 150 of INCREMENT 1, since DECREMENT 3 is low, period counter 92 will count in the up direction. It is counting system clock pulses 82. During the negative half cycles of INCREMENT 1, period counter 92 does not count because both INCREMENT 1 and DECREMENT 3 are low. Once the low to high transition of (SIG A)$^2$ is completed and (SIG A)$^2$ is stable in the high state, INCREMENT 1 signal stays high from that point forward in time. During the period indicated by 154 on FIG. 2, INCREMENT 1 is high and DECREMENT 3 is low. Therefore, during that period of time, period counter 9 is counting clock pulses 82. During low half-cycles 156 of DECREMENT 3 the high state of INCREMENT 1 through NAND gate 78 provides or allows period counter 92 to count up. During high half cycles 158 of DECREMENT 3 (since both DECREMENT 3 and INCREMENT 1 are high) period counter 92 does not count. The net effect is for period counter 92 to average the high and low half-cycles of the noisy transition period of (SIG A)$^2$ so that the total count in period counter 92 at the end of one complete cycle of (SIG A)$^2$ is representative of the time of a complete cycle, absent the noise. The operation is very similar to that of the period counter of U.S. Pat. No. 3,953,794. Since the threshold level of amplifiers 22, 24 and 26 does not change from one noisy leading edge to the next noisy leading edge of Signal A it may be seen that period counter 92 collects a true count representative of the period of the input signal.

Figure 4:
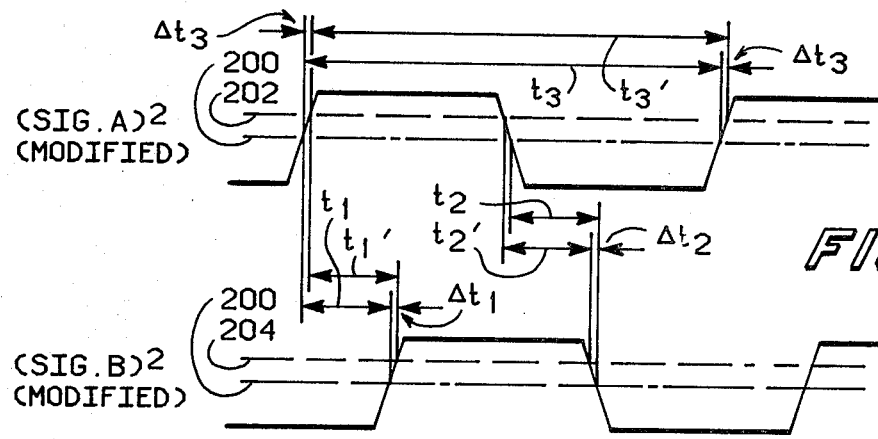
Figure 5:
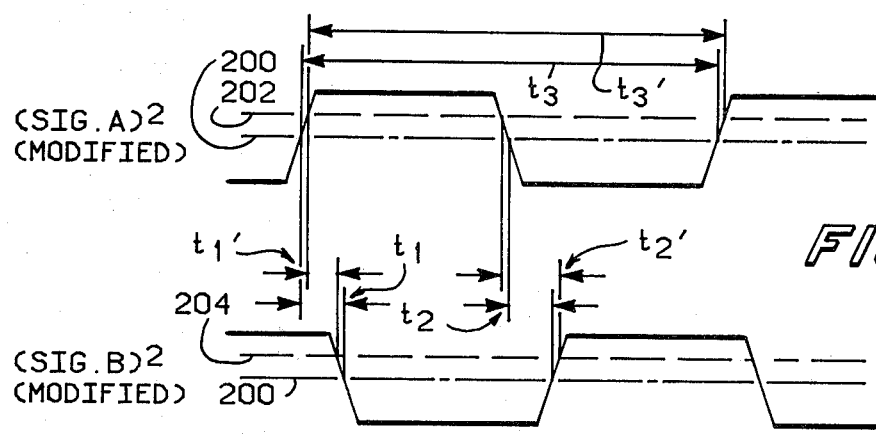
Figure 6:
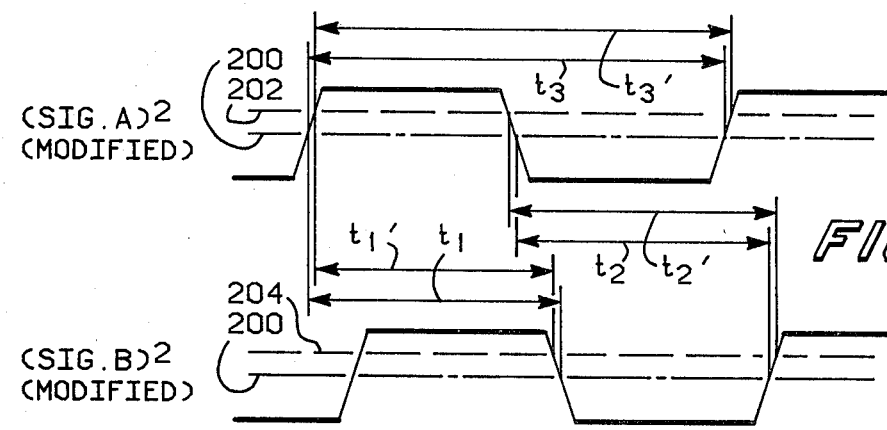

The problem solved by the instant invention is illustrated in FIGS. 4, 5 and 6. There, modified versions of signals (SIG A)$^2$ and (SIG B)$^2$ are shown. They are modified in that the noisy transitions are not shown, although it will be understood by the reader that they are, in fact, noisy. The purpose of FIG. 4 is to illustrate that the threshold level which may be set by amplifiers 22, 24, 26, 36, 38 and 40 may vary and cause a problem in establishing a true phase measurement between SIG A and SIG B. For example, looking at the (SIG A)$^2$ signal of FIG. 4 it may be seen that a true zero level 200 is shown. However the actual threshold level for amplifier 26, for example, may be at 202 because of system drift. (Of course, the threshold may also be lower than that shown at 200, also). Threshold level 202 is slightly higher (exaggerated for emphasis in FIG. 4) than the true zero threshold 200. The value $\Delta t_3$ shown in FIG. 4 is representative of the error caused by the shift of the threshold level. When measuring $t_3$, the period of (SIG A)$^2$, these threshold shifts are essentially "washed out" because the errors are the same at each end of the cycle. This is true because any drift is relatively slow. Therefore the value $t_3$, measured at the true zero crossing points of (SIG A)$^2$ is the same as the value of $t_3'$ measured at the higher threshold level. It is clear, then, that there is no real problem in measuring the period of the signal since the measurement does not vary when there is a relatively long term shift in threshold level.

However, when comparing the threshold of Signal A to Signal B, a problem arises because of the different threshold levels in the two signals. For example, it is clear that if threshold level 204 for (SIG B)$^2$ is at a different level than that of 202 for (SIG A)$^2$, there is an error generated in the measurement of $t_1$. However it is equally clear that the error for the measurement of $t_2$ is the same. That is, $\Delta t_1$ is equal to $\Delta t_2$. An equation for the phase difference between (SIG A)$^2$ and (SIG B)$^2$ is represented:

$$\theta = 360°[(t_1+t_2)/2]/t_3$$

or $$\theta = 180° \times (t_1+t_2)/t_3$$

where $t_1$, $t_2$, and $t_3$ are as shown in FIG. 4. This equation gives accurate results for $\theta$ even if the values of $t_1'$, $t_2'$ and $t_3'$ are substituted therein. However when the positive transition of Signal B is either overlapped with or shortly after the positive transition of Signal A there is not time to make a measurement of the times $t_1$ and $t_2$. It then becomes necessary to measure a time as shown in FIG. 5 between the positive transition of (SIG A)$^2$ and the negative transition of (SIG B)$^2$. In FIG. 5, $t_3$ or $t_3'$ is measured in the same way as in FIG. 4. However $t_1$ or $t_1'$ is measured from the positive signal transition of (SIG A)$^2$ to the following negative transition of (SIG B)$^2$ and the equation must be modified as follows:

$$\theta = (360° \times [(t_1+t_2)/]/t_3) - 180°$$

or $$\theta = [180° \times (t_1 + t_2)/t_3] - 180°$$

It may be seen that this equation differs from the previous equation in the subtraction of 180° from the quantity 180° times $(t_1+t_2)/t_3$. Therefore the circuit utilized to make these measurements must sense that the phase relationship between (SIG A)$^2$ and (SIG B)$^2$ is more than 180°. FIG. 6 illustrates the last case wherein there is a very small phase difference between (SIG A)$^2$ and (SIG B)$^2$. Here the measurement between the positive transitions of (SIG A)$^2$ and (SIG B)$^2$ may be so small as to be difficult to measure. Therefore the measurement is made between the positive transition of (SIG A)$^2$ and the negative transition of (SIG B)$^2$ and a 180° correction factor is utilized as in the previous equation.

It will be understood that the reason the foregoing equations are operable is that the true phase relationship may be represented simply by $t_1/t_3$ where $t_1$ and $t_3$ are true measurements of the time between the true zero crossings of (SIG A)$^2$ and (SIG B)$^2$ and the true period of (SIG A)$^2$ (or (SIG B)$^2$), respectively. By utilizing the above equations, however, it may be seen that in place of utilizing $t_1$ by itself with any attendant errors that may incur as a result, $(t_1+t_2)/2$ is used, the average of $t_1$ and $t_2$. Since the errors in $t_1$ and $t_2$ which result from a shift in the zero crossing point or threshold point are self cancelling; that is, if the error in $t_1$ is on the low side, the error in $t_2$ will be on the high side by the same amount and the average value of $t_1+t_2(t_1+t_2)/2)$ gives a true indication of the phase time difference between (SIG A)$^2$ and (SIG B)$^2$. It only remains to sense whether or not the 180° correction factor must be added. The techniques utilized for measuring the transition under noisy conditions are the same herein as were utilized in U.S. Pat. No. 3,953,794.

Figure 7:
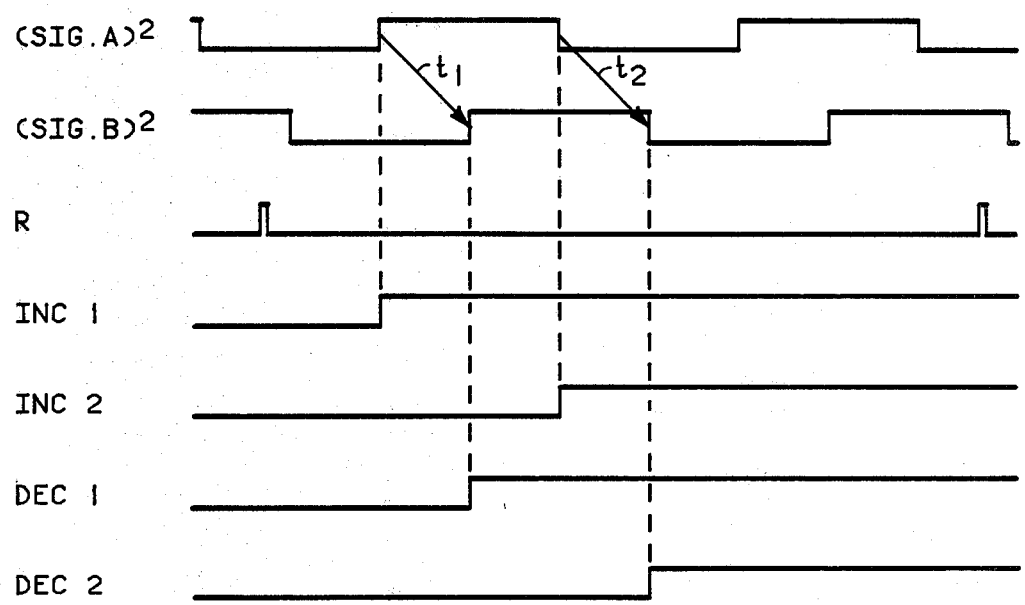

Referring back to FIG. 1, it has already been shown how period counter 92 retains a true period count of the period of (SIG A)$^2$. FIG. 7 is illustrative of a first phase measurement case. This is the case where the phase measurement is made between the positive transition of (SIG A)$^2$ and the next positive transition of (SIG B)$^2$. Arrows labeled $t_1$ and $t_2$ are illustrative of the two measurements which must be made in addition to that of $t_3$. (Of course, it will be unerstood that all of the signals of FIG. 7 are shown without noise. However, it will be further understood that the signals are indeed noisy and that the true zero crossings must be retrieved from the noise.) FIG. 7 shows the relationship between (SIG A)$^2$, (SIG B)$^2$, the reset signal, INCREMENT 1, INCREMENT 2, DECREMENT 1, and DECREMENT 2. The reset signal is generated as was previously described and shown in FIG. 1 and FIG. 2. Note that it occurs part way into the low state of (SIG A)$^2$, but prior to the low portion of (SIG B)$^2$. This will not always be the case, however, it will always occur in the early portion of the low portion of (SIG A)$^2$. INCREMENT 1 has a positive transition coincident with a positive transition of (SIG A)$^2$. INCREMENT 2 has a positive transition corresponding to the next negative transition of (SIG A)$^2$. DECREMENT 1 has a positive transition corresponding to the first positive transition of (SIG B)$^2$ after the positive transition of (SIG A)$^2$. DECREMENT 2 has a positive transition corresponding to the next negative transition of (SIG B)$^2$. The circuit of FIG. 1 provides these relationships. The generation of INCREMENT 1 has already been described, above. INCREMENT 2 is the Q output of flip-flop 76. (SIG A)$^2$ is applied to the D input of flip-flop 76 and goes high on the next clock pulse after a negative transition of (SIG A)$^2$. INCREMENT 2 is locked into the high state by a set signal to flip-flop 76 which is derived from the Q output of flip-flop 70, controlled by clock signal HA (not shown in FIG. 7, but see FIGS. 1 and 2).

Figure 8:
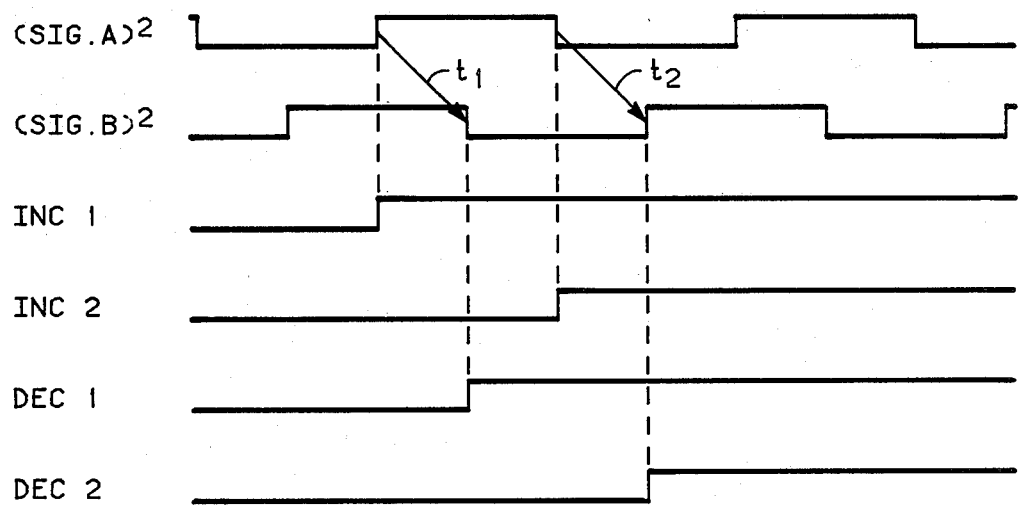

It remains to be determined which of the LB or HB signals, each derived, respectively, from the low portion and the high portion of (SIG B)$^2$, occurs first after the reset signal, R/R. In FIG. 7, LB (not shown) corresponds to the center portion of (SIG B)$^2$ low signal. Clearly, it would occur before HB (which corresponds to the central portion of the high half of (SIG B)$^2$), and after the reset signal R. In this case, the "LB FIRST" signal on line 106 of FIG. 1 would be high (or true). Conversely, in FIG. 8, by similar reasoning, HB occurs prior to LB and the HB FIRST signal on line 104 would be high (or true).

The SIG B input of line 34 is fed to amplifiers 36, 38 and 40. The output of amplifier 38 is biased to provide signal MIN B and amplifier 40 is biased to supply signal MAX B. MIN B and MAX B are fed to DC flip-flop 52. The output of flip-flop 52 are the signals LB and HB. LB is fed to NAND gate 96 and HB is fed to NAND gate 98. The other input to each of these two-input NAND gates is the RESET signal from inverter 62. The outputs of NAND gates 96 and 98 are fed to DC flip-flop 100. This flip-flop determines whether signal HB occurs first or alternatively whether signal LB occurs first after RESET occurs. (See previous paragraph.)

LB FIRST is EXCLUSIVE ORed with HB in exclusive OR gate 102 and the output thereof becomes the SHIFT SIGNAL for the clock inputs of d-type flip-flops 108, 112. This SHIFT SIGNAL is also inverted by inverter 114 and applied to the clock input of d-type flip-flop 110. Flip-flops 108, 110, 112 form a shift register which provides SET and RESET signals to flip-flops 116, 118. RELEASE 1 resets flip-flop 116 when Q of F/F 108 goes low. RELEASE 2 sets F/F 118 when Q of F/F 110 goes low. F/F 116 is set by a low LOCK 1 signal from Q of F/F 110. F/F 118 is reset by a low LOCK 2 signal from Q of F/F 112. All three flip-flops 108, 110, 112 of the shift register are reset by the system RESET line 60. The result of the aforedescribed control of flip-flops 116 and 118 is the production of the DEC 1 (decrement 1) signal on Q of F/F 116 and DEC 2 (decrement 2) signal on Q of F/F 118. Flip-flops 116 and 118 are fed clock pulses on line 82 from system clock generator 84. DEC 1 and DEC 2 are fed to ROM 80 and the output of ROM 80 as is described in Table I:

TABLE I

| INC 1 | INC 2 | DEC 1 | DEC 2 | TOGGLE LSB | TOGGLE LSB | TOGGLE LSB+1 THRU MSB DN | TOGGLE LSB+1 THRU MSB UP |
|---|---|---|---|---|---|---|---|
| 0 | 0 | 0 | 1 | 0 | X | X | |
| 0 | 0 | 0 | 1 | 1 | X | | |
| 0 | 0 | 1 | 0 | 0 | X | X | |
| 0 | 0 | 1 | 0 | 1 | X | | |
| 0 | 0 | 1 | 1 | D | | X | |
| 0 | 1 | 0 | 0 | 0 | X | | |
| 0 | 1 | 0 | 0 | 1 | X | | X |
| 0 | 1 | 1 | 1 | 0 | X | X | |
| 0 | 1 | 1 | 1 | 1 | X | | |
| 1 | 0 | 0 | 0 | 0 | X | | |
| 1 | 0 | 0 | 0 | 1 | X | | X |
| 1 | 0 | 1 | 1 | 0 | X | X | |
| 1 | 0 | 1 | 1 | 1 | X | | |
| 1 | 1 | 0 | 0 | D | | | X |

TABLE I-continued

| INC 1 | INC 2 | DEC 1 | DEC 2 | TOGGLE LSB | TOGGLE LSB+1 THRU MSB DN | TOGGLE LSB+1 THRU MSB UP |
|---|---|---|---|---|---|---|
| 1 | 1 | 0 | 1 | 0 | X | |
| 1 | 1 | 0 | 1 | 1 | X | X |
| 1 | 1 | 1 | 0 | 0 | X | |
| 1 | 1 | 1 | 0 | 1 | X | X |
| 1 | 1 | 1 | 1 | D | | |

Note:
D = don't care

LSB (least significant bit) flip-flop 130 is toggled by means of a clock (C) input from two-input AND gate 130 which, in turn, is fed from ROM 80 (according to Table I, above) and the system clock 82. F/F 130 is reset by the RESET signal on line 60. Phase counter 128 produces LSB+1 through MSB (most significant bit). An UP signal for counter 128 is derived from two-input AND gate 124 which is fed from ROM 80 UP output and system clock 82. A DN (down) signal for counter 128 is derived from two-input AND gate 126 which is fed from ROM 80 DN output and system clock 82. The UP and DN signals from ROM 80 are provided according to Table I, above. The first five columns to the left of Table I, above, denote the states of the Increment 1, Increment 2, Decrement 1, Decrement 2 and LSB signals (the latter from the Q output of F/F 130).

The outputs of phase counter 128 and period counter 92 may be used to calculate the phase relationship between the first and second noisy signals. (The MEASUREMENT COMPLETE signal indicates when the correct values are available in the counters and the SUBTRACT 0° and SUBTRACT 180° signals indicate the correct equation to use in the calculation.) This may be accomplished by means of manual calculation or by more automated means such as a calculator or a wired-in computer.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

What is claimed is:

1. An improved method for measuring a phase angle relationship of a first and a second noisy signals having the same period, each signal having a spectrum comprising only odd harmonics of a sine wave having the same period, each signal having a finite shape at each zero crossing time wherein said noisy signals may have a direct current bias voltage thereon, comprising the steps of:
   amplifying and limiting the first and second noisy signals to provide first and second bilevel signals, respectively, said bilevel signals being noisy in the time vicinity of the zero crossing times;
   generating clock pulses of a predetermined repetition rate;
   enabling a first count of said clock pulses during a time between a first zero crossing time of the first noisy signal and a first subsequent zero crossing time of said second noisy signal;
   enabling a second count of said clock pulses during a time between a second sequential zero crossing time of the first noisy signal and a second subsequent zero crossing time of said second noisy signal;
   enabling a third count of the period of one of the noisy signals; and
   outputting said first, second and third counts and a signal signifying completion of said counts.

2. The method according to claim 1 wherein said enabling of said first and second counts is addressed to a single counter and comprises the further step of:
   accumulating in the single counter a count which is responsive to a total of said first and second counts.

3. An improved apparatus for providing an indication of a phase angle relationship of a first and a second noisy signal; the first and second signals having the same period, each signal having a spectrum consisting only of odd harmonics of a sine wave having the same period, and each signal having a finite slope at each zero crossing time, wherein said noisy signals may have a direct current bias voltage thereon; comprising:
   means for amplifying and limiting the first and second noisy signals to provide first and second bilevel signals, respectively, said bilevel signals being noisy in the time vicinity of the zero crossing times;
   means for providing clock pulses of a predetermined repetition rate;
   at least one counter means and another counter means; and
   logic means for enabling said at least one counter means to accumulate a first and second count, said first count beginning at a zero crossing time of said first noisy signal and ending at a next zero crossing time of said second noisy signal, said second count beginning at a first subsequent zero crossing time of said first noisy signal and ending at a next zero crossing time of said second noisy signal, and said logic means for enabling said another counting means to accumulate a third count, said third count being responsive to a period of one of said first and second noisy signals, said third count beginning on a zero crossing of said noisy signal in one of a positive and negative direction and ending on a zero crossing of said noisy signal in a same of said one of positive and negative directions, and for providing outputs representative of said accumulations of said first and second counts and said third count.

4. The apparatus according to claim 3 wherein said at least one counting means is a single counter which accumulates said first and second count.

5. The apparatus according to claim 3 or 4 wherein said counter means are adapted to count said clock pulses when said noisy signals are one of above and below a predetermined reference voltage so that said counts during said noisy times in the vicinity of said zero crossings are integrated by said counter means.

* * * * *